US012364131B2

(12) United States Patent
Choi et al.

(10) Patent No.: US 12,364,131 B2
(45) Date of Patent: Jul. 15, 2025

(54) DISPLAY PANEL STRUCTURE WITH UNI-COLOR DATA LINES

(71) Applicant: Google LLC, Mountain View, CA (US)

(72) Inventors: Sangmoo Choi, Palo Alto, CA (US); Sun-il Chang, San Jose, CA (US)

(73) Assignee: Google LLC, Mountain View, CA (US)

( * ) Notice: Subject to any disclaimer, the term of this patent is extended or adjusted under 35 U.S.C. 154(b) by 457 days.

(21) Appl. No.: 17/756,382

(22) PCT Filed: Feb. 7, 2020

(86) PCT No.: PCT/US2020/017273
§ 371 (c)(1),
(2) Date: May 24, 2022

(87) PCT Pub. No.: WO2021/158240
PCT Pub. Date: Aug. 12, 2021

(65) Prior Publication Data
US 2022/0406854 A1 Dec. 22, 2022

(51) Int. Cl.
H10K 59/35 (2023.01)
G09G 3/3266 (2016.01)
(Continued)

(52) U.S. Cl.
CPC ......... *H10K 59/353* (2023.02); *G09G 3/3266* (2013.01); *H10K 59/1213* (2023.02); *H10K 59/131* (2023.02); *G09G 2310/08* (2013.01)

(58) Field of Classification Search
CPC .................................................. H10K 59/121
See application file for complete search history.

(56) References Cited

U.S. PATENT DOCUMENTS 10,140,903 B2   11/2018   Lee et al.
10,210,804 B2   2/2019    Kim et al.
(Continued)

FOREIGN PATENT DOCUMENTS

CN   104617131   5/2015
CN   109285502   1/2019
(Continued)

OTHER PUBLICATIONS

International Preliminary Report on Patentability in International Appln. No. PCT/US2020/017273, mailed on Aug. 18, 2022, 11 pages.
(Continued)

*Primary Examiner* — Yu-Hsi D Sun
(74) *Attorney, Agent, or Firm* — Fish & Richardson P.C.

(57) ABSTRACT

A display device includes a plurality of subpixel emissive areas of a first color, a second color, and a third color arranged in an array having a plurality of rows and columns. Rows of the array include subpixel emissive areas arranged in a repeating pattern of a first color subpixel emissive area, a second color subpixel emissive area, a third color subpixel emissive area, and a second color subpixel emissive area. Alternating columns of the array include subpixel emissive areas: (a) arranged in a repeating pattern of a subpixel emissive area of the first color and a subpixel emissive areas of the third color, and (b) including only subpixel emissive areas of the second color. The display device further includes a plurality of scan lines, a plurality of column lines, and a plurality of electronic subpixel circuits arranged in the array. Each electronic subpixel circuit is configured for receiving electronical signals from a scan line and from a column line and for converting the received signals into a current signal provided to one of the subpixel emissive areas to drive light emission from the subpixel emissive area,
(Continued)

where electronic subpixel circuits arranged in a column of the array drive columns of emissive areas having only one color.

17 Claims, 12 Drawing Sheets

(51) Int. Cl.
*H10K 59/121* (2023.01)
*H10K 59/131* (2023.01)

(56) References Cited

U.S. PATENT DOCUMENTS

| 10,354,582 | B2 | 7/2019 | Kim |
| 2011/0025669 | A1* | 2/2011 | Kwak ................. G09G 3/3225 345/82 |
| 2011/0043500 | A1 | 2/2011 | Kwak et al. |
| 2017/0124953 | A1 | 5/2017 | Shim |
| 2018/0174511 | A1 | 6/2018 | Kim et al. |
| 2019/0114459 | A1 | 4/2019 | Ma et al. |
| 2019/0279563 | A1 | 9/2019 | Hwang et al. |
| 2020/0027941 | A1 | 1/2020 | Luan et al. |

FOREIGN PATENT DOCUMENTS

| CN | 109427278 | 3/2019 |
| CN | 110517636 | 11/2019 |
| CN | 111584548 | 8/2020 |
| EP | 3696804 A1 | 8/2020 |
| TW | 201732765 | 9/2017 |
| WO | 2018016745 A1 | 1/2018 |

OTHER PUBLICATIONS

Office Action in Chinese Appln. No. 202080089252.X, mailed on Mar. 4, 2024, 28 pages (with English translation).
Office Action in European Appln. No. 20709948.2, mailed on May 2, 2024, 12 pages.
International Search Report and Written Opinion for PCT Application No. PCT/US2020/017273, mailed on Oct. 9, 2020, 16 pages.
Office Action in Taiwan Appln. No. 110103462, mailed on Feb. 17, 2025, 13 pages (with English machine translation).

* cited by examiner

DISPLAY PANEL STRUCTURE WITH UNI-COLOR DATA LINES

CROSS-REFERENCE TO RELATED APPLICATION

This application is a 35 U.S.C. § 371 National Phase Entry Application from PCT/US2020/017273, filed on Feb. 7, 2020, entitled "DISPLAY PANEL STRUCTURE WITH UNI-COLOR DATA LINES", the disclosure of which is incorporated herein by reference in its entirety.

FIELD OF THE DISCLOSURE

The present disclosure relates to flat panel displays and, in particular, to panel structures having data lines connected to different subpixels of the same color.

BACKGROUND

In recent years, flat panel displays have become larger and have been offered in new shapes. For example, aspect ratios of displays for mobile devices have increased from 16:9 to 21:9. In addition, refresh frequencies (i.e., frame rates) for these displays have increased. For example, frame rates of displays for mobile devices have increased from 60 Hertz (Hz) to 120 Hz. Both of these display trends correspond to an increase in power consumption by electrical circuitry driving the displays.

When the length of a display is increased, each column of the display includes additional pixels. All pixels in each column are controlled by signals carried by a column data line. When the length of the display is increased, these signals must have a higher switching frequency in order to control the additional pixels. In other words, to maintain (or increase) a frame rate, while increasing a length of the display, requires a high column line switching frequency (e.g., >100 kilohertz). In addition to the additional pixel circuits in a column signal line increasing the capacitance of the data lines, the increase of the switching frequency further linearly increases the dynamic power consumption in the driving circuitry. Furthermore, at these frequencies, the increased parasitic capacitance of each column data line can negatively affect a time constant related to the switching of each pixel. As a result, larger switching devices must be used, but larger switching devices require more power. Accordingly, more power may be necessary to achieve high frame rates for displays having high aspect ratios. This power consumption trend for some example displays is shown in TABLE 1.

TABLE 1

Display Dynamic Power Consumption

| Aspect Ratio | 18.5:9 | 19:9 | 21:9 |
|---|---|---|---|
| Frame Rate (Hz) | 60 | 90 | 120 |
| Column Line Switching Frequency | 89 | 137 | 202 |
| Normalized Power Consumption | 1 | 1.5 | 2.3 |

SUMMARY

In a general aspect, a display device includes a plurality of subpixel emissive areas of a first color, a plurality of subpixel emissive areas of a second color, and a plurality of subpixel emissive areas of a third color. The plurality of subpixel emissive areas of the first, second, and third colors are arranged in an array, with the array having a plurality of rows and columns. Rows of the array include subpixel emissive areas arranged in a repeating pattern of a first color subpixel emissive area, second color subpixel emissive area, a third color subpixel emissive area, and a second color subpixel emissive area, and with alternating columns of the array including subpixel emissive areas: (a) arranged in a repeating pattern of a subpixel emissive area of the first color and a subpixel emissive areas of the third color, and (b) including only subpixel emissive areas of the second color. The display device further includes a plurality of scan lines, a plurality of column lines, and a plurality of electronic subpixel circuits arranged in the array. Each electronic subpixel circuit is configured for receiving electronical signals from a scan line and from a column line and for converting the received signals into a current signal provided to one of the subpixel emissive areas to drive light emission from the subpixel emissive area, where electronic subpixel circuits arranged in a column of the array drive columns of emissive areas having only one color.

Implementations can include one or more of the following features, alone or in any combination with each other. For example, the emissive areas of the first second and third colors can include organic light emitting diodes.

The first color can include red (R), the second color can include green (G), the third color can include blue (B), and the plurality of subpixel emissive areas of the first, second, and third colors can be arranged in a Pentile RGBG array.

Subpixel circuits in a column of the array can be electrically connected to a same column line.

The display device can include a plurality of subpixel circuit output ports, where each electronic subpixel circuit of the plurality of electronic subpixel circuits is electrically connected to an emissive area by a subpixel circuit output port of the plurality of subpixel circuit output ports.

Each subpixel emissive area of the second color, the electronic subpixel circuit that provides the current signal to the emissive areas of the second color, and the output port that electrically connects the subpixel area of the second color to the electronic subpixel circuit that provides the current signal to the emissive areas of the second color can be located in a same row and in a same column, and, in every other row, each subpixel emissive area of the first and third colors can be located in a different column from the column in which the electronic subpixel circuit that provides the current signal to the emissive area is located, and in other rows each subpixel emissive area of the first and third colors can be located in a same column as the electronic subpixel circuit that provides the current signal to the emissive area.

In every other row, each subpixel emissive area of the first color can be located in a column having a column number higher than a column number of the electronic subpixel circuit that provides the current signal to the subpixel emissive area, and in rows for which each subpixel emissive area of the first color is located in a column having a column number higher than a column number of the electronic subpixel circuit that provides the current signal to the subpixel emissive area, each subpixel emissive area of the third color can be located in a column having a lower column number lower than a column number of the electronic subpixel circuit that provides the current signal to the subpixel emissive area.

In every other row, each subpixel emissive area of the first color can be located in a column having a column number that is two higher than a column number of the electronic subpixel circuit that provides the current signal to the subpixel emissive area, and in rows for which each subpixel emissive area of the first color is located in a column having a column number that is two higher than a column number of the electronic subpixel circuit that provides the current signal to the subpixel emissive area, each subpixel emissive area of the third color can be located in a column having a lower column number that is two lower than a column number of the electronic subpixel circuit that provides the current signal to the subpixel emissive area.

In the every other rows, the subpixel output ports that electrically connect an emissive area of a first or third color to an electronic subpixel circuit, can extend over a distance that is greater than a width of one subpixel circuit.

In every other row, each subpixel emissive area of the first color and each subpixel emissive area of the third color can be located in a column having a higher column number higher than a column number of the electronic subpixel circuit that provides the current signal to the subpixel emissive area.

In the every other row, in a first column, each subpixel emissive area of the third color can be located in a column having a column number that is one higher than the column number of the electronic subpixel circuit that provides the current signal to the subpixel emissive area, and, in the every other row, in columns other than the first column, each subpixel emissive area of the first color and of the third color can be located in a column having a column number that is two higher than the column number of the electronic subpixel circuit that provides the current signal to the subpixel emissive area.

In the every other rows, for columns other than the first column, the subpixel output ports that electrically connect an emissive area of a first or third color to an electronic subpixel circuit, can extend over a distance that is greater than a width of one subpixel circuit.

The first column can include a plurality of subpixel circuits but not include subpixel emissive areas.

Each of the subpixel circuit can include a transistor configured for providing a current to a subpixel emissive area in response to one or more signals provided on a scan line and/or column line.

An amount of light emitted from the subpixel emissive area can be based on the provided current.

The display can further include a scan line driver configured for providing signals to the scan lines, a column line driver configured for providing signals to the column lines, and a timing controller configured to provide timing control signals to the scan line driver and to the column line driver.

The plurality of rows can include more than 1300 rows, and the plurality of columns can include more than 700 columns.

Optional features of one aspect may be combined with any other aspect described herein.

Aspects can advantageously provide reduced voltage switching for a scan line, on average, during operation of the display, thus reducing power losses due to parasitic capacitance.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily drawn to scale and may not be in scale relative to each other. Like reference numerals designate corresponding parts throughout the several views.

DETAILED DESCRIPTION

Figure 1:
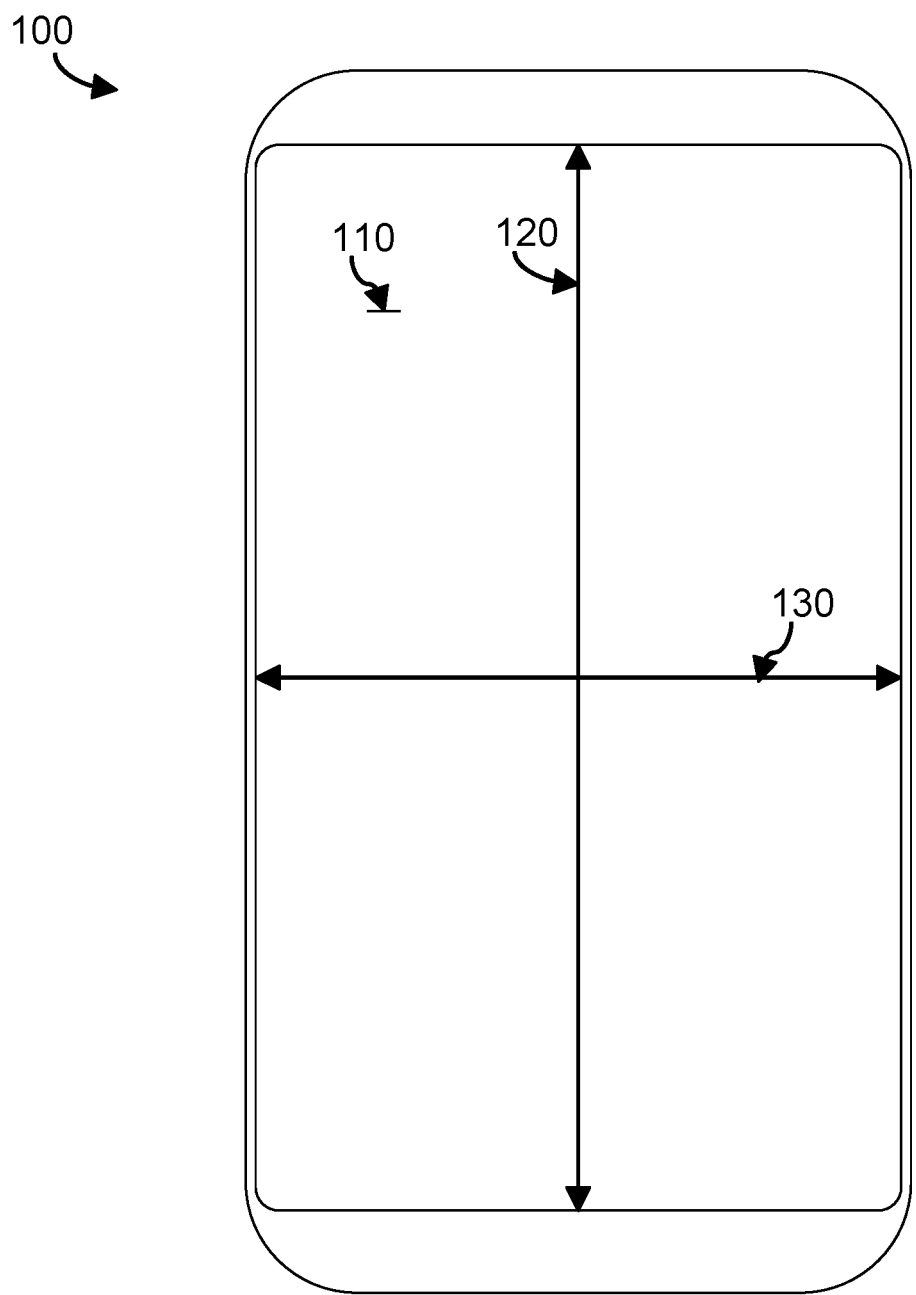
FIG. 1 depicts a possible front surface of a mobile device with a display.

FIG. 1 depicts an example of a mobile computing device (i.e., a mobile device). A front surface of the mobile device 100 is shown. The front surface includes a display 110 having an aspect ratio (AR) defined as a ratio of a height 120 to a width 130 (i.e., AR=height/width). A display 110 for the mobile device 100 may have a height (a.k.a. length) 120 that is more than twice the width 130. For example, a high AR display may have an AR that is greater than 18.5 to 9.

Figure 2:
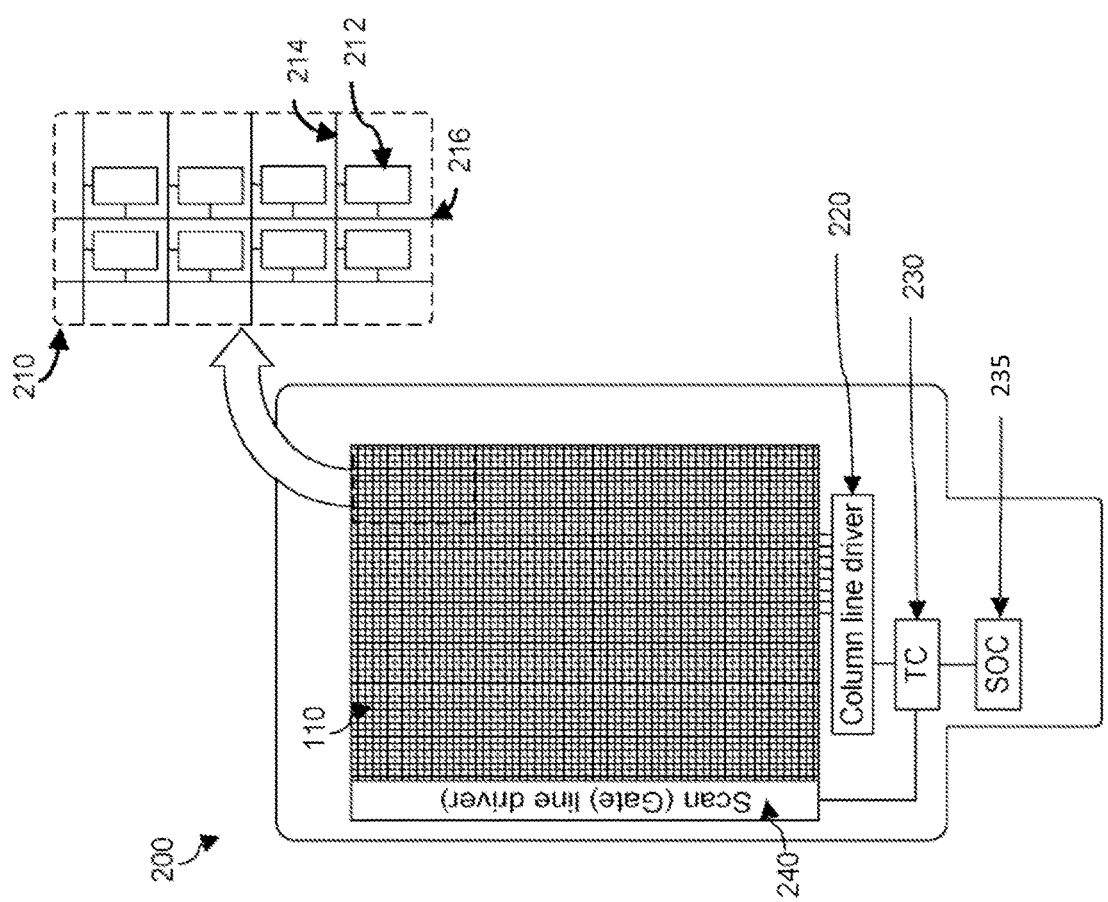
FIG. 2 schematically depicts a possible implementation of a display system for a mobile computing device.

FIG. 2 schematically depicts a possible display system that can be used with the mobile device 100 of FIG. 1. The display system 200 includes a display panel (e.g., display 110) having emissive pixels and subpixels that are controlled by electronic pixel circuits and/or subpixel circuits to render a visual output (e.g., text, graphics, video, images, etc.) on the display. A subpixel can be considered as an individual light emitting element, generally having a monochromatic light output, whereas a pixel can be considered as a combination of two or more light emitting elements, where the different elements have different colors, so the pixel can be controlled to output a range of colors. The display may be any active matrix display, such as an active matrix organic light emitting diode (AMOLED) display.

A magnified portion 210 of the display 110 is shown. The magnified portion 210 illustrates the row/column configuration of subpixels. In some implementations, the device 110 can include more than 700 columns and more than 1300 rows. For example, the device can include at least 750 columns and at least 1334 rows. For example, the device can include at least 1080 columns and at least 1920 rows. The light emission of each subpixel 212 can be controlled by a scan (gate) signal line 214 (i.e., a horizontal control line) and by a column data line 216 (i.e., a vertical control line). In some implementations, and as illustrated in FIG. 2, all subpixels in a row share can be driven by the same gate signal line, and all subpixels in a column can be driven by the same column data line. In some implementations, as described in more detail below, all subpixels in a row can be driven by the same gate signal line, and subpixels having the same color but located in different columns can be driven by the same column data line. For example, a single column line can drive subpixels having a particular color located in odd numbered rows of a column and also can drive subpixels having the particular color located in even numbered rows of a different column.

The scan signal lines 214 of the display 110 are controlled by gate drivers 240. The column data lines are controlled by column line drivers 220. A timing controller (TC) 230 can control signals to the scan line drivers 240 and to the column line drivers 220 to ensure proper timing of signals to individual subpixels to achieve a desired light emission from the subpixels. The timing controller 230 can receive control signals from a system-on-a-chip that includes, for example, a central processing unit (CPU).

Sending electrical signals to the subpixels to control the emission of light from the subpixels involves alternating the voltage levels on the scan and column lines. As mentioned previously, higher frame rates and/or longer displays (i.e., higher AR displays) can lead to high switching frequencies of the signals on the scan and column lines. Such a high frequency of voltage signal changes. together with the increased column line parasitic capacitance due to the high aspect ratio, can lead to an undesirably high dynamic power consumption in driving of the display panel. Accordingly, when a column line connects to many pixels and/or when the display is operated at a high frame rate, it may be desirable to reduce/minimize the number of voltage level changes that are required, in practice, to program a new image data to pixels displaying new images on the screen.

Figure 3A:
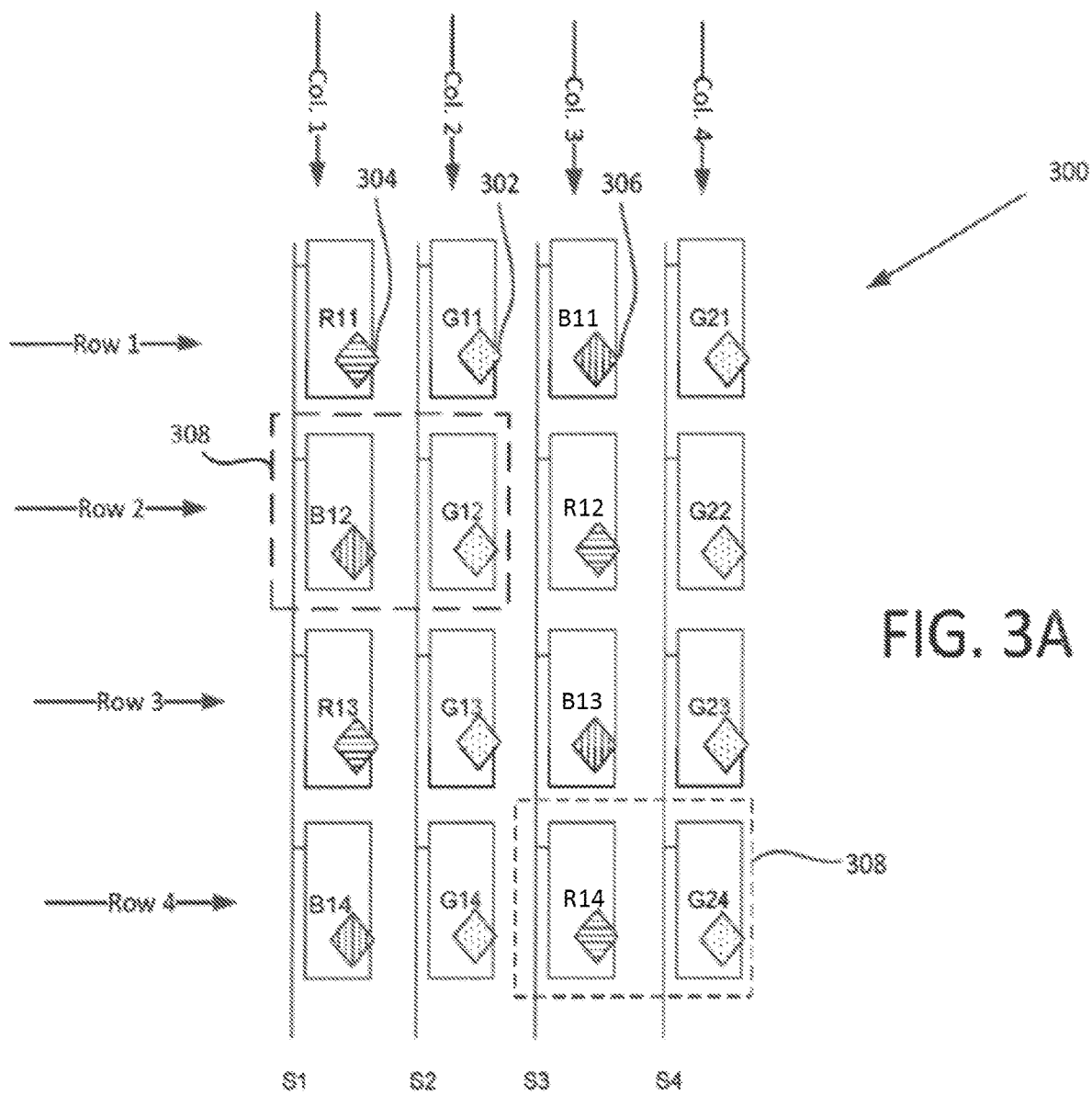
FIG. 3A is schematic diagram of a Pentile RGBG array of red, green, and blue subpixels in a display.

FIG. 3A is schematic diagram of a Pentile RGBG array of 300 subpixels of a first, second, and third color (e.g., red, green, and blue) in a display and circuits that drive subpixels. Each red, green, and blue subpixel can include an LED of the corresponding color. In each row of the Pentile RGBG array 300, green subpixels 302 are interleaved with alternating red subpixels 304 and blue subpixels 306. As shown in FIG. 3A, green subpixel LEDs are shown by dotted diamonds; red subpixel LEDs are shown by horizontally-striped diamonds; and blue subpixel LEDs are shown by vertically-striped diamonds. In FIG. 3A, circuits that drive an LED in the array are labeled with a capital letter corresponding to the color of the LED that is driven by the circuit and a two-digit index value, where the second digit of the index value indicates the row number (from top to bottom) of the driven LED, and the first digit of the index value indicates the number (from left to right) of the LED of the designated color in the designated row. Thus, for example, the circuit labelled R11 drives the red LED in the top row and the left-most column; the circuit labelled G11 drives the green LED in the top row and in the second column; the circuit labelled R22 drives the red LED in the second row from the top and in the third column (which is the first red LED in the second row when proceeding from left to right); etc.

Columns of the Pentile RGBG array 300 alternate between having all green subpixels 302 and having alternating red subpixels 304 and blue subpixels 306. For example, the left most column shown in FIG. 3A, in which subpixels are driven by voltages supplied by signal S1, includes subpixels that alternate between red and blue, and the column neighboring the left-most column includes all green subpixels that are driven by voltages supplied by signal S2.

In the Pentile RGBG array 300, a pixel 308 of the display can be considered to include a combination of a red subpixel 304 and a green subpixel 302 or a combination of a blue subpixel 306 and a green subpixel 302. Thus, pixels 300 in the Pentile RGBG array 300 can provide a spectrum of colors. With tight packing of the pixels in modern high-resolution displays, a user generally cannot perceive individual pixels 300, and the overall effect of the array 300 perceived by the user is that any color can be emitted from any location on the display. Furthermore, with the Pentile RGBG array arrangement of subpixels, subpixels of certain colors (e.g., red and blue) can be decreased in number, compared to a conventional RGB stripe arrangement of subpixels (RGBRGB subpixels for two pixels), such that a display panel using the Pentile RGBG array of subpixels uses one-third fewer subpixels than a conventional RGB stripe display with the same resolution. Thus, higher-resolution, brighter devices are possible with the Pentile RGBG array arrangement of subpixels.

Figure 3B:
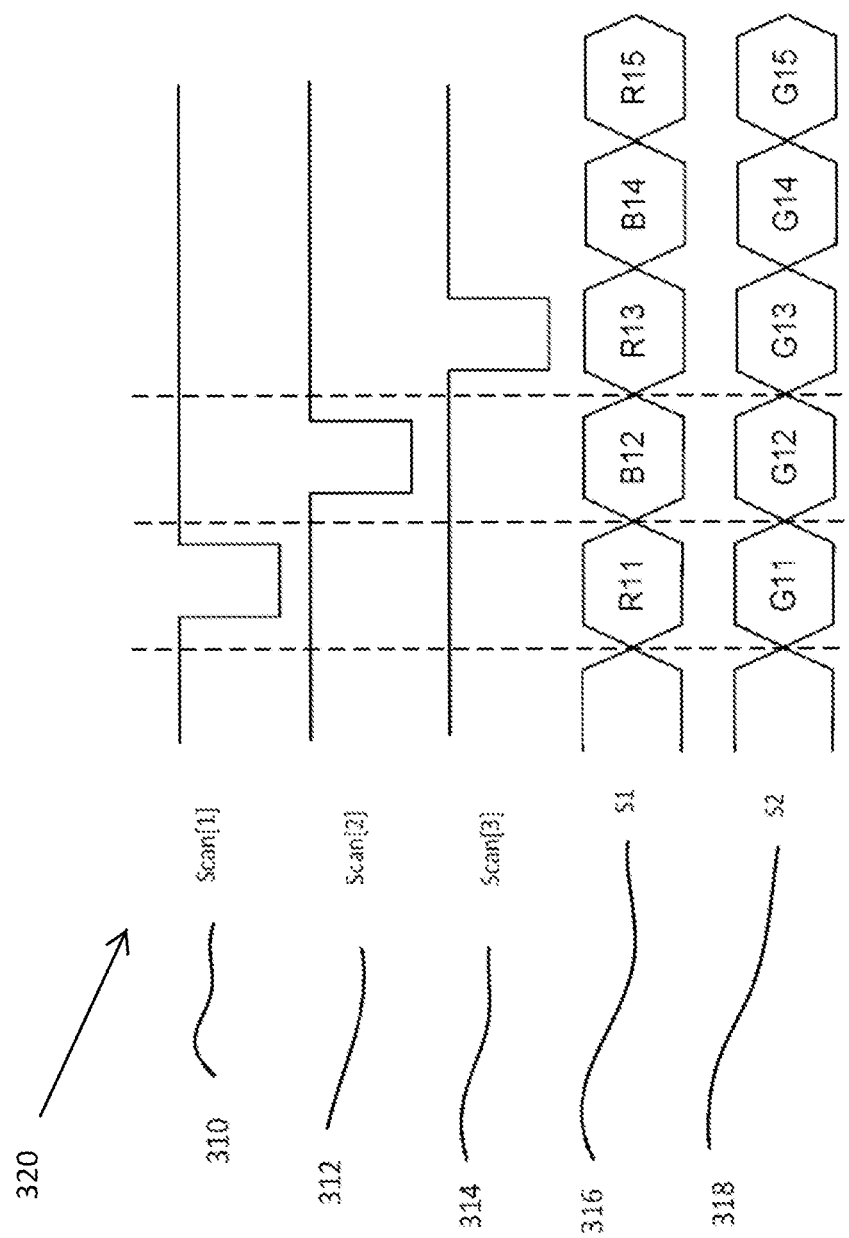
FIG. 3B is a timing diagram illustrating the addressing of individual subpixels in a Pentile RGBG array.

FIG. 3B is a timing diagram 320 illustrating the addressing of individual subpixels in the Pentile RGBG array 300. In the timing diagram 320, the state of scanline[1] 310 represents the voltage applied to the scanline that controls subpixels in row 1; the state of scanline[2] 312 represents the voltage applied to the scanline that controls subpixels in row 2; and the state of scanline[3] 314 represents the voltage applied to the scanline that controls subpixels in row 3. The state of the scanline controlling the subpixels in row 4 is not shown in FIG. 3B but can be understood as an extension from lines 310, 312, and 314. The state of column line 316 represents the voltage applied to the column line that controls subpixels in column 1; and the state of column line 318 represents the voltage applied to the column line that controls subpixels in column 2. The state of the column lines controlling subpixels in columns 3 and 4 is not shown in FIG. 3B but can be understood as an extension from lines 316 and 318.

The states of the scan lines 310, 312, 314 and the states of the column line signals S1 and S2 indicate that a voltage is switched between high and low states on individual scan lines 310, 312, 314 corresponding to rows 1, 2, and 3, for fixed periods of time. When the voltage on a scan line for a row is "ON," which is the case when the scan line voltage level is low for p-channel transistor switches in the pixel circuit, this allows the subpixel circuits in the row to be updated with a new data voltage, by signals on the column lines for the subpixels in the ON row. When the signal on the scan line for the row is "OFF," which is the case when the scan line voltage level is high for p-channel transistor switches in the pixel circuit, the subpixels in the row are disconnected from the column data lines, and cannot be updated.

Figure 4A:
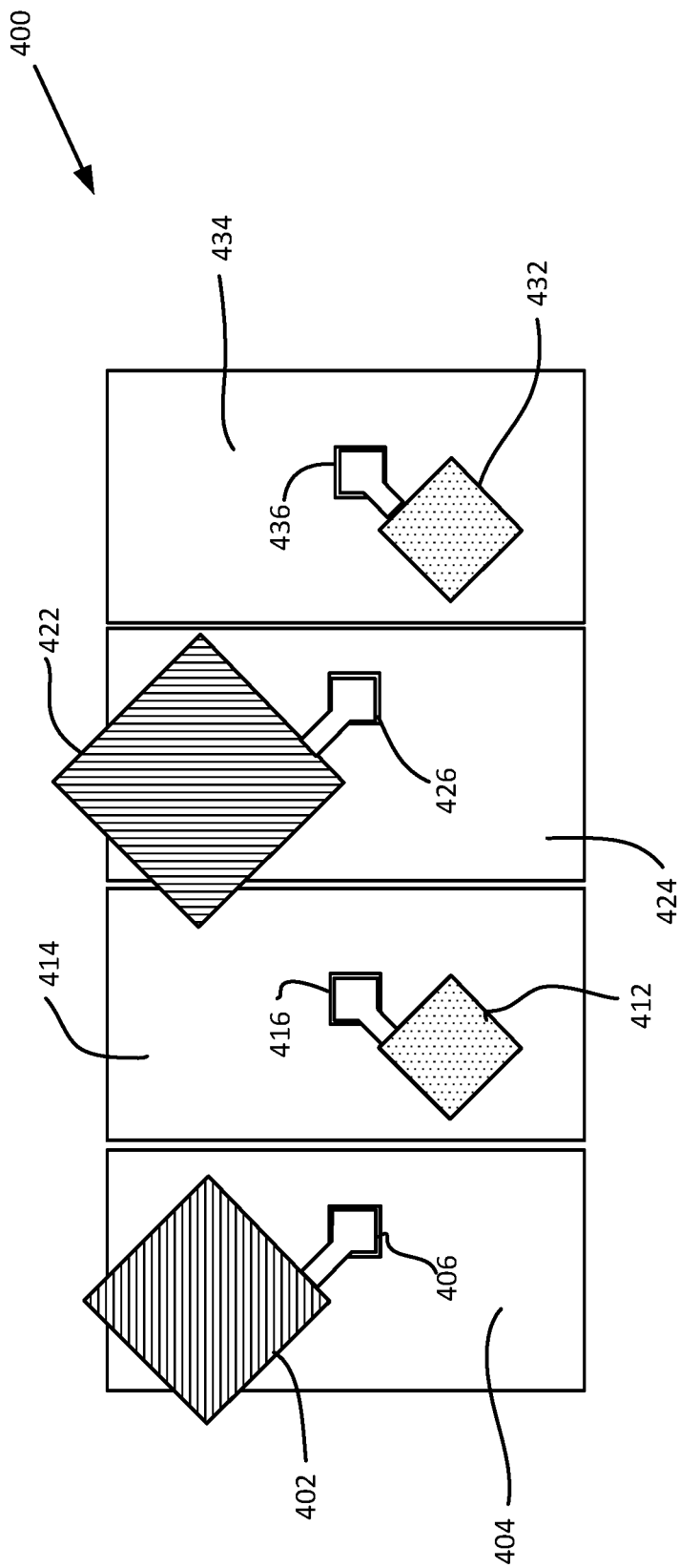
FIG. 4A is a schematic top view of connections between electrical pixel circuits and emissive subpixel elements of a display having subpixels arranged in a Pentile RGBG.

FIG. 4A is a schematic top view of connections between electrical pixel circuits and emissive subpixel elements of a display 400 having subpixels arranged in a Pentile RGBG array. As shown in FIG. 4A, a unit cell of the display can include a red emissive area 402, a first green emissive area 412, a blue emissive area 422, and a second green emissive area 432. The red emissive area 402 and the first green emissive area 412 together define a first pixel, and the blue emissive area 422 the second green emissive area 432 together define a second pixel.

Each emissive area 402, 412, 422, 432 is respectively connected to a subpixel circuit 404, 414, 424, 434 that, for example, receives electrical signals from the scan line and the column line associated with the subpixel and converts the received signals into a current to be applied to semiconductor materials that drive the emission of light from the emissive area of the subpixel. The subpixel circuit 404, 414, 424, 434 for a subpixel can be physically and electrically connected to a respective emissive area 402, 412, 422, 432 of the subpixel by a respective pixel circuit output port 406, 416, 426, 436. A subpixel circuit output port 406, 416, 426, 436 can include an electrically conductive material (e.g., metal) that transmits a current signal from the subpixel circuit to the emissive area.

Figure 4B:
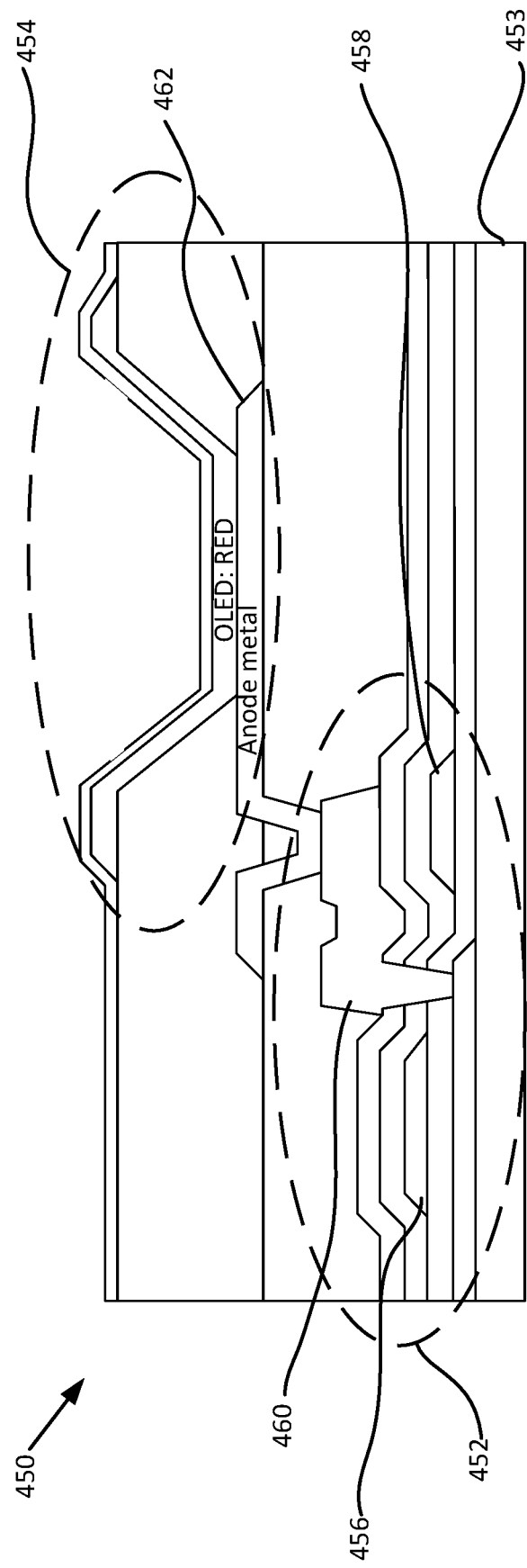
FIG. 4B is a schematic cross-sectional view of an example subpixel having an electrical subpixel circuit for driving an LED.

FIG. 4B is an example schematic cross-sectional view of a red subpixel 450 having an electrical subpixel circuit 452 for driving an LED 454. The electrical subpixel circuit 452 and the LED 454 are fabricated on a common substrate 453. The electrical subpixel circuit 452 includes a plurality of conductive, insulating, and semiconductor layers that can act as a transistor to supply a driving current from the circuit 452 to the LED 454 in response to electrical signals received on the scan and column lines for the subpixel 450. For example, FIG. 4B depicts a metal layer which is used for transistor gate electrodes 456 and scan line traces 458, and another metal layer 460 which is used for column data lines and interconnections between electrodes in subpixel circuits. The metal contact 460 of the subpixel circuit 452 can be electrically connected to a subpixel circuit output port 462 that transmits a driving current to the LED 454. The subpixel circuit includes a plurality of electrical circuit elements, e.g. transistors and capacitors, and FIG. 4B show a part of the circuit components.

Figure 5:
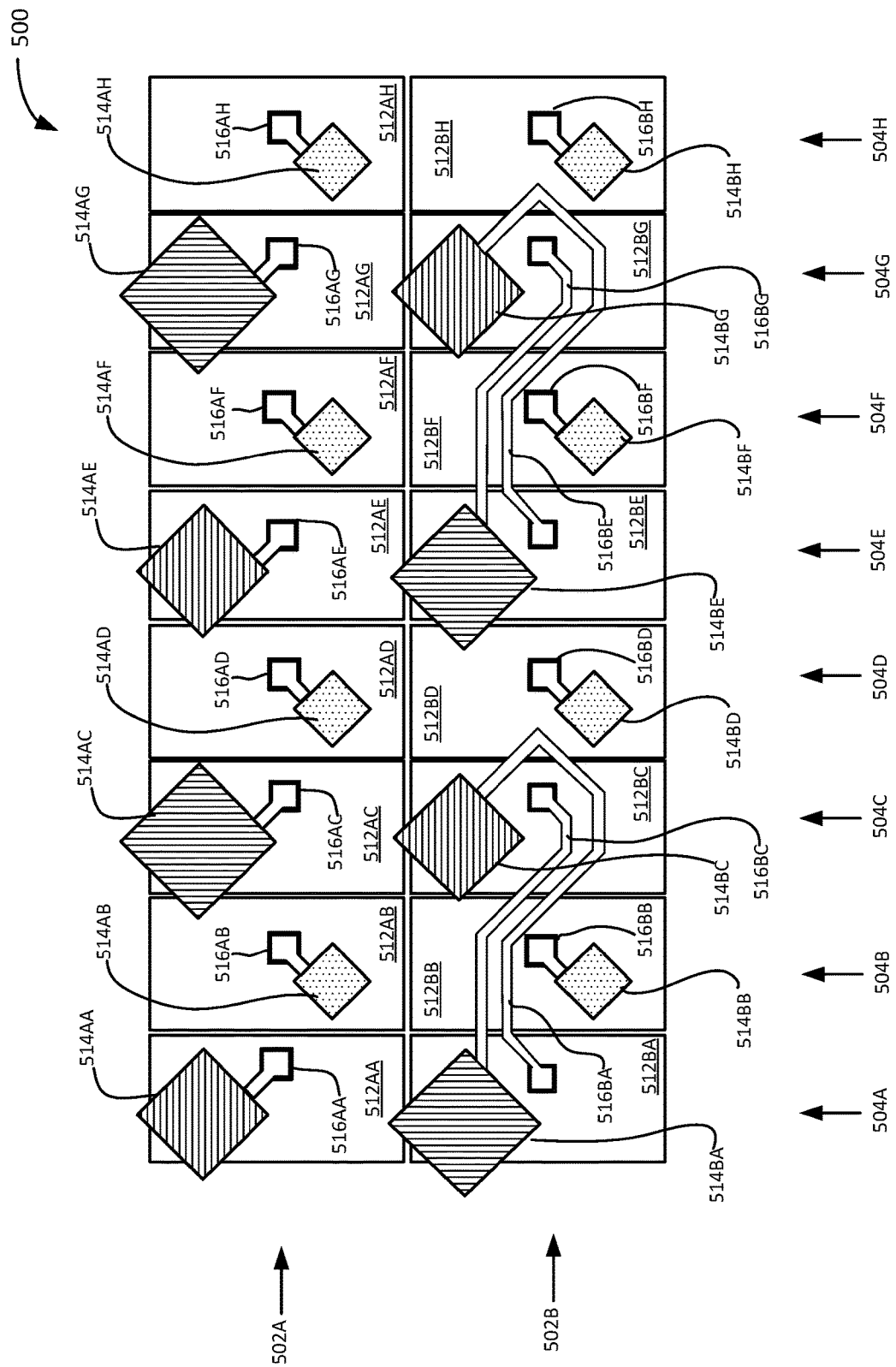
FIG. 5 is a schematic diagram of a layout of emissive elements, subpixel circuits, and subpixel output ports in a Pentile RGBG array, where the subpixel output ports electrically connect an emissive element to a subpixel circuit.

FIG. 5 is a schematic diagram of a layout 500 of emissive elements, subpixel circuits, and subpixel output ports in a Pentile RGBG array, where the subpixel output ports electrically connect an emissive element to a subpixel circuit. The Pentile RGBG array includes rows 502A, 502B and columns 504A, 504B, 504C, 504D, 504E, 504F, 504G, 504H of emissive elements and subpixel circuits. For example, the Pentile RGBG array can include red emissive elements 514AA, 514AE, 514BC, and 514BG, green emissive elements 514AB, 514AD, 514AF, 514AH, 514BB, 514BD, 514BF, and 514BH, and blue emissive elements 514AC, 514AG, 514BA, and 514BE. Different subpixel circuits in a same row are driven by signals on a same scan line, and different subpixel circuits in a same column are driven by signals on a same column line.

In a first row 502A, each subpixel circuit 512AA, 512AB, 512AC, 512AD, 512AE, 512AF, 512AG, 512AH is electrically connected to a respective emissive element 514AA, 514AB, 514AC, 514AD, 514AE, 514AF, 514AG, 514AH that is located in the same row and column as the subpixel circuit. The subpixel circuits 512AA, 512AB, 512AC, 512AD, 512AE, 512AF, 512AG, 512AH are electrically connected, respectively, to emissive elements 514AA, 514AB, 514AC, 514AD, 514AE, 514AF, 514AG, 514AH by way of a subpixel output port 516AA, 516AB, 516AC, 516AD, 516AE, 516AF, 516AG, 516AH.

In a second row 502B, each green emissive element 514BB, 514BD, 514BF, and 514BH is electrically connected (by way of a respective subpixel output port 516BB, 516BD, 516BF, and 516BH) to a respective subpixel circuit 512BB, 512BD, 512BF, and 512BH that is located in the same row and column as the green emissive element. However, in the second row 502B, the blue emissive elements 514BA and 514BE, and the red emissive elements 514BC and 514BG are not connected to subpixel circuits located in the same column as the emissive element. Rather, emissive elements of a first color are connected to, and driven by subpixel circuits of a lower column number (i.e., to the left in FIG. 5) than the column number of the emissive element, and emissive elements of a second color are connected to, and driven by subpixel circuits of a higher column number (i.e., to the right in FIG. 5) than the column number of the emissive element. For example, as shown in FIG. 5, red subpixel elements 514BC and 514BG in the third and seventh columns of the array are connected, respectively, to subpixel circuits 512BA and 512BE in the first and fifth columns of the array, and blue subpixel elements 514BA and 514BE in the first and fifth columns are connected, respectively, to subpixel circuits 512BC and 512BG in the third and seventh columns of the array.

This pattern can be repeated throughout an array of pixels in a Pentile RGBG display, such that in alternating rows of the array: (1) each emissive element of the row is connected to, and driven by, a subpixel circuit in the same column as the emissive element and (2) emissive elements of a first color are connected to, and driven by, subpixel circuits of a lower column number than the column number of the emissive element and emissive elements of a second color are connected to, and driven by subpixel circuits of a higher column number than the column number of the emissive element. For example, in odd number rows, each emissive element of the row may be driven by a subpixel circuit in the same column as the emissive element and in even number rows emissive elements of a first color (e.g., red) can be connected to, and driven by, subpixel circuits of a lower column number than the column number of the emissive elements of the first color and emissive elements of a second color (e.g., blue) can be connected to, and driven by subpixel circuits of a higher column number than the column number of the emissive elements of the second color.

In such a layout, where, within every other row, emissive elements of a first color are connected to, and driven by, subpixel circuits of a lower column number than the column number of the emissive elements and emissive elements of a second color are connected to, and driven by subpixel circuits of a higher column number than the column number of the emissive elements, the subpixel output port 516BA, 516BC, 516BE, 516BG that connects subpixel circuits of one column to emissive elements in another column extend over a distance greater than the width of one subpixel circuit.

As a consequence of the arrangement shown in FIG. 5, in which columns 504A, 504C, 504E, 504G of the Pentile RGBG array include emissive elements of alternating colors, and in which, for alternating rows of the array, emissive elements are driven by subpixel circuits located in different columns than the emissive element that is driven, column lines can be connected to subpixel circuits that drive emissive elements of only one color. For example, the column line connected to subpixel circuits 512AA and 512 BA located in column 504A can drive red emissive elements 514AA and 514BC, and the column line connected to subpixel circuits 512AC and 512 BC located in column 504C can drive blue emissive elements 514AC and 514BA.

As a result of column lines being connected to subpixel circuits that drive emissive elements of only one color, the number of times the voltage level changes in the column data line can be reduced, on average, during operation of the display, as compared with a conventional configuration in which a column line is connected to subpixels of different color emissive elements, more than one, thus reducing power losses due to column line parasitic capacitance. The reduced voltage switching can be due to having a column line control emissive elements of only one color, so that in regions of an image on the display where a color is relatively monochromatic, the voltage signal on the signal line need not be switched appreciably to send signals to different emissive elements in different rows but in the same column that is controlled by the column line.

Figure 6:
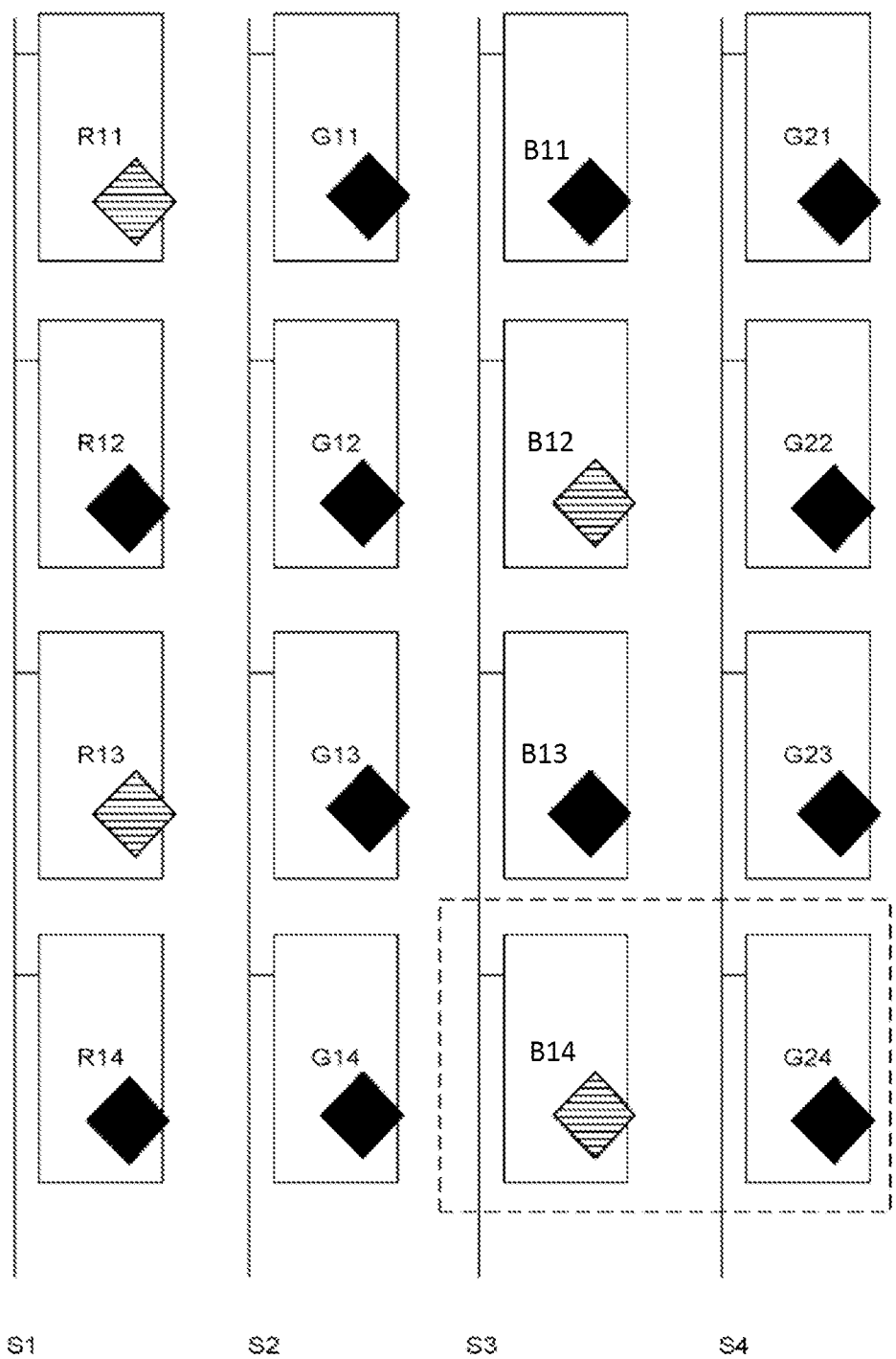
FIG. 6 is a schematic diagram of four columns and four rows of red, green, and blue emissive elements of an RGBG array display.

FIG. 6 is a schematic diagram of four columns and four rows of red, green, and blue emissive elements of an RGBG array display. The emissive elements are connected to subpixels circuits that are driven by signals S1, S2, S3, S4, where each column line driven by S1, S2, S3, and S4 drives emissive subpixels circuits that are connected to emissive elements of a single color (i.e., red, green, or blue), as described above with reference to FIG. 5.

FIG. 6 depicts a state in which the display outputs red light, such that red subpixels emissive areas are turned on and green and blue subpixel emissive areas are turned off. Thus, in FIG. 6, green subpixel LEDs and blue subpixel LEDs are shown by black diamonds, while red subpixel LEDs are shown by horizontally-striped diamonds. In FIG. 6, circuits that drive an LED in the array are labeled with a capital letter corresponding to the color of the LED that is driven by the circuit and a two-digit index value, where the second digit of the index value indicates the row number (from top to bottom) of the driven LED, and the first digit of the index value indicates the number (from left to right) of the LED of the designated color in the designated row. Thus, for example, the circuit labelled R11 drives the red LED in the top row and the left-most column; the circuit labelled G11 drives the green LED in the top row and in the second column; the circuit labelled R22 drives the red LED in the second row from the top and in the third column (which is the first red LED in the second row when proceeding from left to right); etc.

Figure 7:
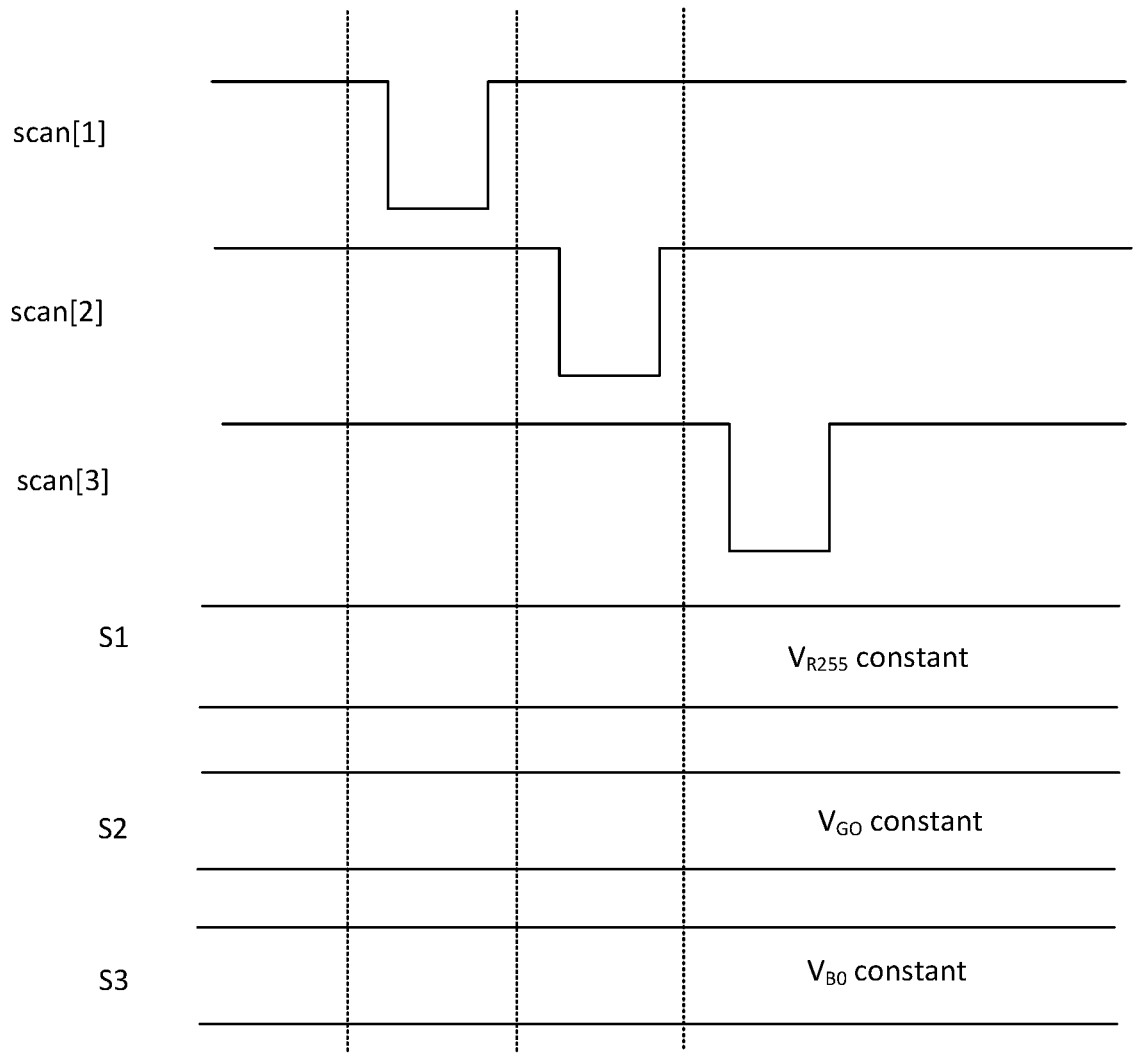
FIG. 7 is a schematic timing diagram of signals provided on scan lines and on column lines for providing an all red output from the emissive elements of an RGBG array.

FIG. 7 is a schematic timing diagram of signals scan[1], scan[2], and scan[3] and column line signals S1, S2, and S3 for providing an all red output from the emissive elements of FIG. 6. To provide the all red output, a signal on column line driven by signal S1 is maximized to turn on the red emissive elements connected to S1, while the signals on column lines driven by signals S2 and S3 are minimized to turn off the green and blue emissive elements connected to signals S2 and S3. In addition, signals scan[1], scan[2], and scan[3] are switched sequentially between high and low values to provide the ON signal for red emissive elements, the OFF signal for green emissive elements, and the OFF signal for blue emissive elements to the corresponding red, green, and blue elements of successive rows as time progresses. As can be seen from the timing diagram of FIG. 7, the values of the signals provided on the column lines driven by S1, S2, and S3 are constant when a monochromatic output is displayed, because column lines connect to subpixel circuits that drive emissive elements having a same color. In contrast, if alternating rows of the column driven by the "S1" signal were connected to alternating color emissive elements (e.g., red and blue), then the voltage on S1 would have to be switched between a maximum value and a minimum value every time a new row is addressed by scan[1], scan[2], and scan[3], and this frequent change of voltage would cause higher power losses due to the parasitic capacitance on the column lines.

Figure 8:
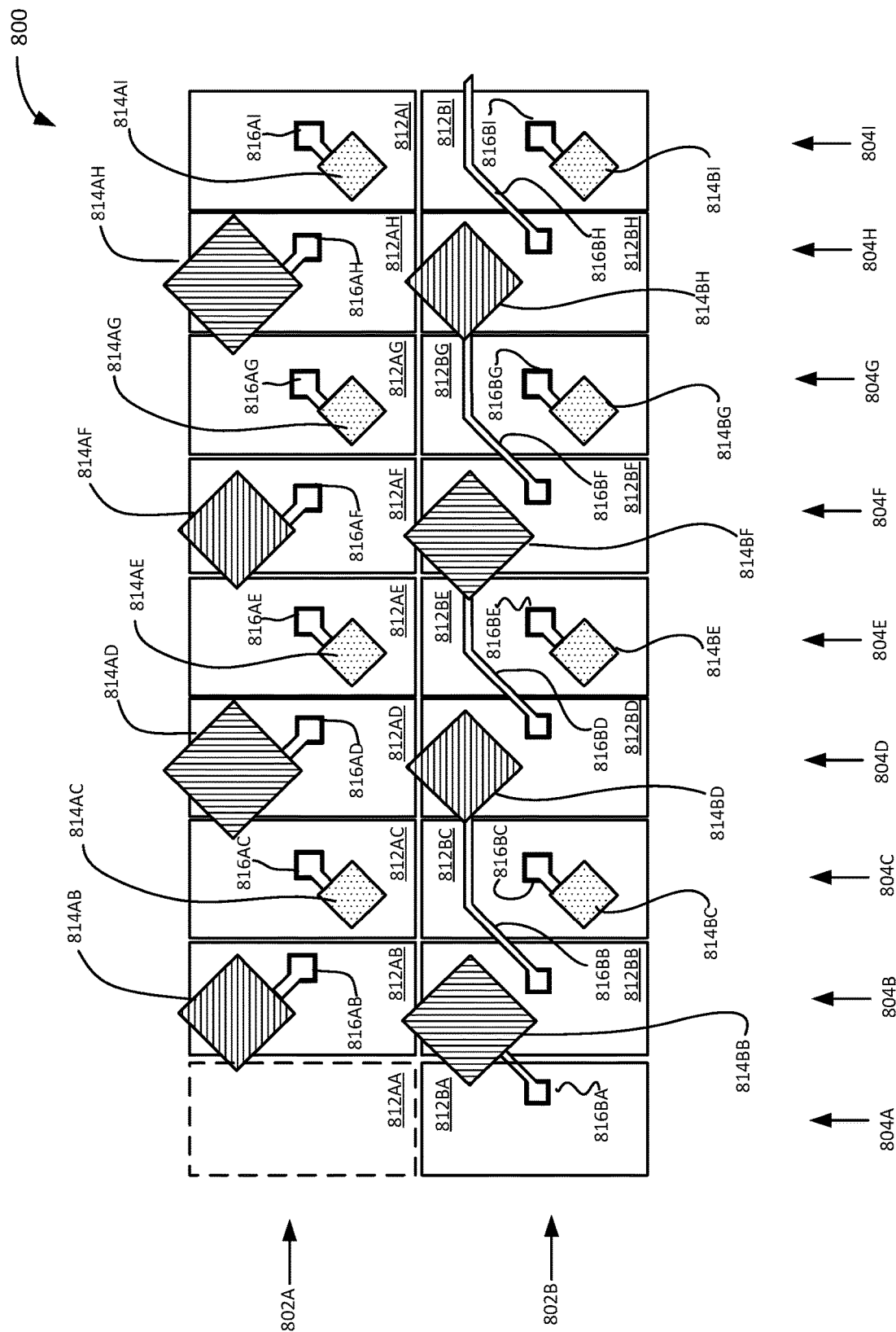
FIG. 8 is a schematic diagram of another layout of emissive elements, subpixel circuits, and subpixel output ports in a Pentile RGBG array, where the subpixel output ports electrically connect an emissive element to a subpixel circuit.

FIG. 8 is a schematic diagram of another layout 800 of emissive elements, subpixel circuits, and subpixel output ports in a Pentile RGBG array, where the subpixel output ports electrically connect an emissive element to a subpixel circuit. The Pentile RGBG array includes rows 802A, 802B and columns 804A, 804B, 804C, 804D, 804E, 804F, 804G, 804H, 804I of emissive elements and subpixel circuits. For example, the Pentile RGBG array can include red emissive elements 814AB, 814AF, 814BD, and 814BH, green emissive elements 814AC, 814AE, 814AG, 814AI, 814BC, 814BE, 814BG, and 814BI, and blue emissive elements 814AD, 814AH, 814BB, and 814BF. Different subpixel circuits in a same row are driven by signals on a same scan line, and different subpixel circuits in a same column are driven by signals on a same column line.

In a first row 802A, each subpixel circuit 812AB, 812AC, 812AD, 812AE, 812AF, 812AG, 812AH, and 812AI is electrically connected to a respective emissive element 814AB, 814AC, 814AD, 814AE, 814AF, 814AG, 814AH, and 814AI that is located in the same row and column as the subpixel circuit. The subpixel circuits 812AB, 812AC, 812AD, 812AE, 812AF, 812AG, 812AH, and 812AI are electrically connected, respectively, to emissive elements 814AB, 814AC, 814AD, 814AE, 814AF, 814AG, 814AH, 814AI by way of a subpixel output ports 816AB, 816AC, 816AD, 816AE, 816AF, 816AG, 816AH, and 814AI. Row 802A also includes a "dummy" subpixel circuit 812AA that is not connected to any emissive element.

In a second row 802B, each green emissive element 814BC, 814BE, 814BG, and 814BI is electrically connected (by way of a respective subpixel output port 816BC, 816BE, 816BG, and 816BI) to a respective subpixel circuit 812BC, 812BE, 812BG, and 812BI that is located in the same row and column as the green emissive element by way of a respective subpixel output port 816BC, 816BE, 816BG, and 816BI. However, in the second row 802B, the blue emissive elements 814BB and 814BF, and the red emissive elements 814BD and 814BH are not connected to subpixel circuits located in the same column as the emissive element. Rather, each emissive element of a first color (e.g., red) and of a second color (e.g., blue) is connected to, and driven by a subpixel circuit of column number that is different than the column number of the emissive element. For example, as shown in FIG. 8, red subpixel elements 814BD and 814BH in the fourth and eighth columns of the array are connected, respectively, to subpixel circuits 812BB and 812BF in the second and sixth columns of the array, and blue subpixel element 814BF in the sixth column is connected to subpixel circuit 812BD in the fourth column of the array. This pattern is repeated throughout the row 802B, with emissive elements in a column, N, being connected to, and driven by, for example, subpixel circuits in columns N-2. The first emissive element 814BB of the of the row 802B that neighbors the subpixel circuit 812BA directly above or below a "dummy" subpixel circuit 812AA can be connected to the subpixel circuit directly neighboring the emissive element 814BB.

This pattern can be repeated throughout an array of pixels in a Pentile RBGB display, such that in alternating rows of the array: (1) each emissive element of the row is connected to, and driven by, a subpixel circuit in the same column as the emissive element and (2) each emissive element of a first color and of a second color is connected to, and driven by, a subpixel circuit of a lower column number than the column number of the emissive element. For example, in odd number rows each emissive element of the row may be driven by a subpixel circuit in the same column as the emissive element and in even number rows emissive elements of a first color (e.g., red) and of a second color (e.g., blue) can be connected to, and driven by, subpixel circuits of a lower column number than the column number of the emissive element.

In such a layout, where, within every other row, each emissive element of a first color and of a second color are connected to, and driven by, subpixel circuits of a lower column number than the column number of the emissive element, the subpixel output ports 816BB, 816BD, 816BF, 816BH that connects the subpixel circuit of one column to the emissive element in another column extend over a distance that is greater than the width of one subpixel circuit.

As a consequence of the arrangement shown in FIG. 8, in which columns 804B, 804D, 804F, 804H of the Pentile RGBG array include emissive elements of alternating colors, and in which, for alternating rows of the array, emissive elements are driven by subpixel circuits located in different columns than the emissive element that is driven, column lines are connected to subpixel circuits that drive emissive elements of only one color. For example, the column line connected to subpixel circuits 812AB and 812BB located in column 804B can drive red emissive elements 814AB and 814BD, and the column line connected to subpixel circuits 812AD and 812BD located in column 804D can drive blue emissive elements 814AD and 814BF.

As with the configuration described with respect to FIG. 5, with the configuration of emissive elements, subpixel circuits, and subpixel output ports of FIG. 8, column lines are connected to subpixel circuits that drive emissive elements of only one color, such that the amount of voltage switched on and off of a column line can be reduced, on average, during operation of the display, as compared with a conventional configuration in which a column line is connected to subpixels of different color emissive elements, more than one color, thus reducing power losses due to column line parasitic capacitance. The reduced voltage switching can be due to having a column line control emissive elements of only one color, so that in regions of an image on the display where a color is relatively monochromatic, the voltage signal on the signal line need not be switched appreciably to send signals to different emissive element in different rows but in the same column that is controlled by the column line.

Figure 9:
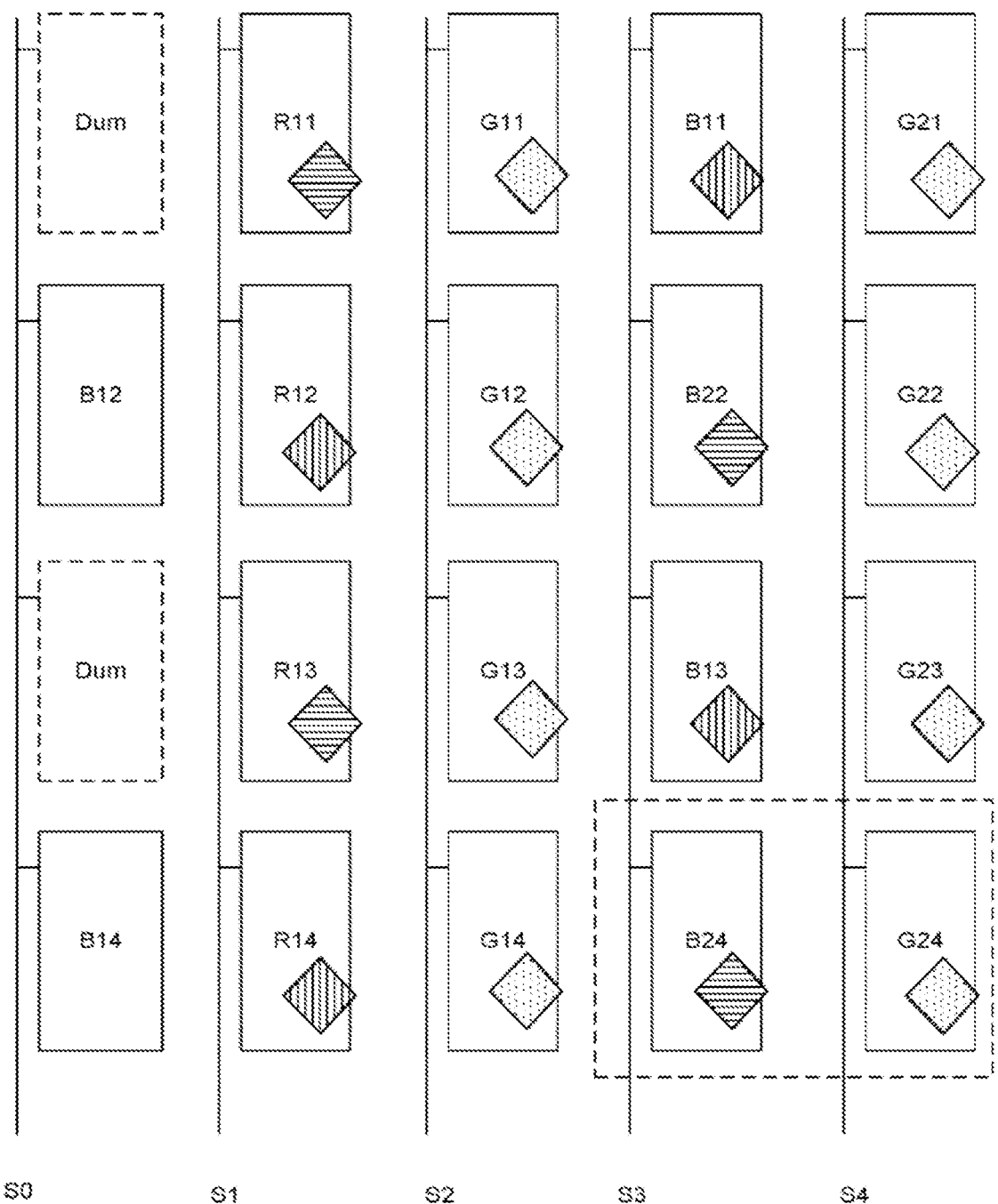
FIG. 9 is a schematic diagram of five columns and four rows of red, green, and blue emissive elements of an RGBG array display, in which the emissive elements are connected to, and driven by, signals provided column lines, where each column line drives emissive elements of a single color.

FIG. 9 is a schematic diagram of five columns and four rows of red, green, and blue emissive elements of an RGBG array display, in which the emissive elements are connected to and driven by subpixel circuits in response to signals S0, S1, S2, S3, and S4 provided on corresponding column lines, where each column line signal S0, S1, S2, S3, and S4 provides signals to circuit elements connected to emissive elements of a single color (i.e., red, green, or blue), as described above with reference to FIG. 8.

As shown in FIG. 9, green subpixel LEDs are shown by dotted diamonds; red subpixel LEDs are shown by horizontally-striped diamonds; and blue subpixel LEDs are shown by vertically-striped diamonds. In FIG. 9, circuits that drive an LED in the array are labeled with a capital letter corresponding to the color of the LED that is driven by the circuit and a two-digit index value, where the second digit of the index value indicates the row number (from top to bottom) of the driven LED, and the first digit of the index value indicates the number (from left to right) of the LED of the designated color in the designated row. Thus, for example, the circuit labelled R11 drives the red LED in the top row and the second column from the left; the circuit labelled G11 drives the green LED in the top row and in the third column from the left; the circuit labelled R12 drives the red LED in the second row from the top and in the fourth column from the left (which is the first red LED in the second row when proceeding from left to right). Furthermore, for example, the circuit labelled B11 drives the blue LED in the top row and the fourth column from the left; and the circuit labelled B12 drives the blue LED in the second row from the top and in the second column from the left.

Figure 10:
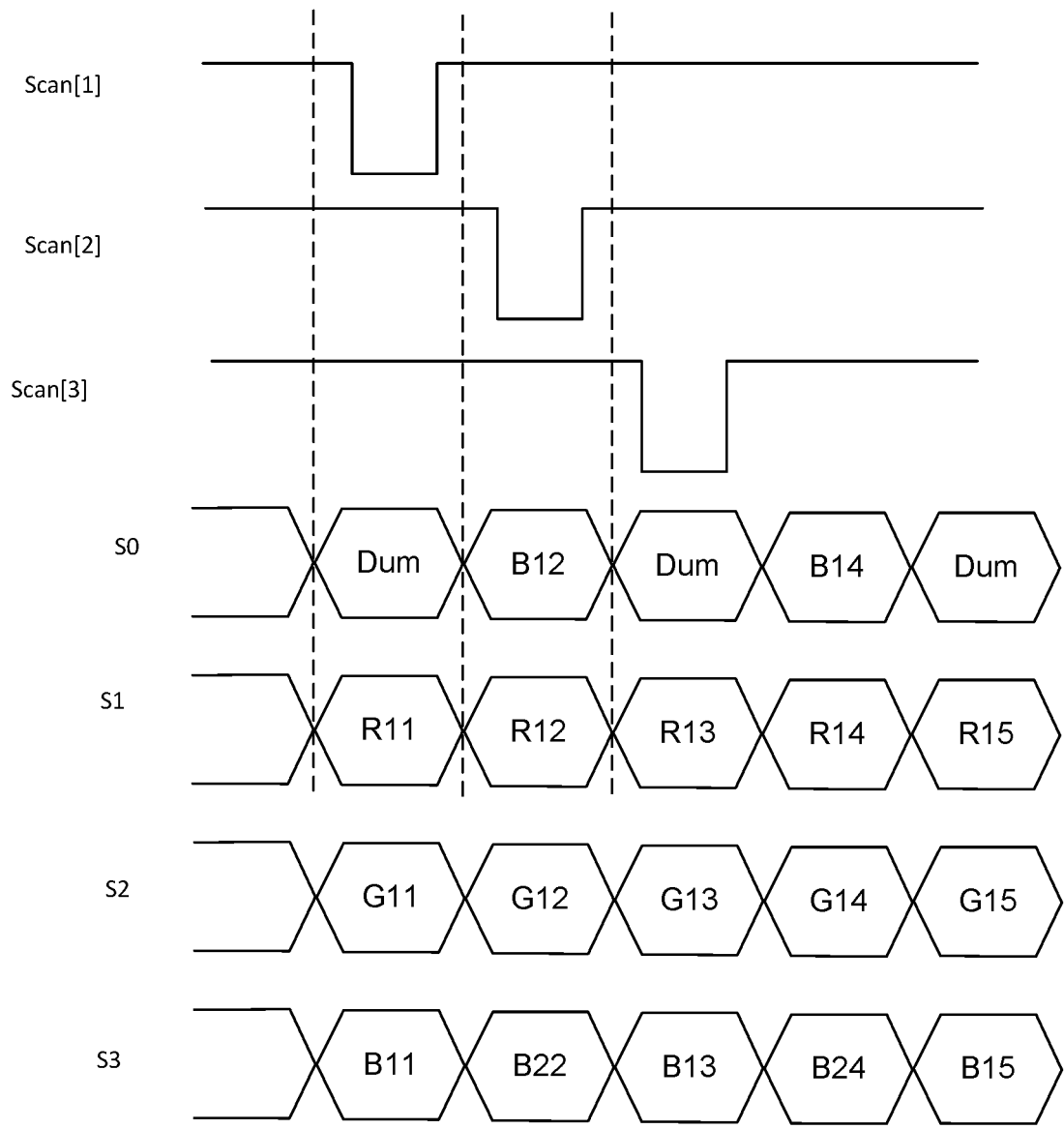
FIG. 10 is a schematic timing diagram of signals provided on scan lines and on column lines for providing an output from the emissive elements of an RGBG array.

FIG. 10 is a schematic timing diagram of signals scan[1], scan[2], and scan[3] and column line signals S0, S1, S2, and S3 for providing an output from the emissive elements of FIG. 9. As can be seen from the timing diagram, column lines S0, S1, S2, and S3 provide signals to circuit elements to drive emissive elements of a single color, so that in regions of the displayed image where the color and brightness does not change much from one row to the next (as is generally the case), a signal S0, S1, S2, and S3 on a column line also does not change much. Therefore, the voltage switching on and off each of the column line signals S0, S1, S2, and S3 is reduced as compared with a configuration in which emissive elements of more than one color are controlled by a column line, thus reducing parasitic capacitance and reducing power loss.

In the specification and/or figures, a number of embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations.

The implementations described herein can include various combinations and/or sub-combinations of the functions, components, and/or features of the different implementations described.

Although the disclosed inventive concepts include those defined in the attached claims, it should be understood that the inventive concepts can also be defined in accordance with the following embodiments:

Embodiment 1 is a display device comprising: a plurality of subpixel emissive areas of a first color, a plurality of subpixel emissive areas of a second color, and a plurality of subpixel emissive areas of a third color, where the plurality of subpixel emissive areas of the first, second, and third colors are arranged in an array, the array having a plurality of rows and a plurality of columns. Rows of the array include subpixel emissive areas arranged in a repeating pattern of a first color subpixel emissive area, second color subpixel emissive area, a third color subpixel emissive area, and a second color subpixel emissive area. Alternating columns of the array include subpixel emissive areas: (a) arranged in a repeating pattern of a subpixel emissive area of the first color and a subpixel emissive areas of the third color, and (b) including only subpixel emissive areas of the second color. The display device further comprises a plurality of scan lines, a plurality of column lines, and a plurality of electronic subpixel circuits arranged in the array, with each electronic subpixel circuit configured for receiving electronical signals from a scan line and from a column line and for converting the received signals into a current signal provided to one of the subpixel emissive areas to drive light emission from the subpixel emissive area, where electronic subpixel circuits arranged in a column of the array drive columns of emissive areas has only one color.

Embodiment 2 is display device of embodiment 1, where the emissive areas of the first second and third colors include organic light emitting diodes.

Embodiment 3 is The display device of embodiment 1 or 2, where the first color includes red (R), the second color includes green (G), the third color includes blue (B), and where the plurality of subpixel emissive areas of the first, second, and third colors are arranged in a Pentile RGBG array.

Embodiment 4 is display device of any of embodiments 1 through 3, where subpixel circuits in a column of the array are electrically connected to a same column line.

Embodiment 5 is display device of any of embodiments 1 through 4, and further comprising a plurality of subpixel circuit output ports, where each electronic subpixel circuit of the plurality of electronic subpixel circuits is electrically connected to an emissive area by a subpixel circuit output port of the plurality of subpixel circuit output ports.

Embodiment 6 is display device of embodiment 5 where each subpixel emissive area of the second color, the electronic subpixel circuit that provides the current signal to the emissive areas of the second color, and the output port that electrically connects the subpixel area of the second color to the electronic subpixel circuit that provides the current signal to the emissive areas of the second color are located in a same row and in a same column, and where, in every other row, each subpixel emissive area of the first and third colors is located in a different column from the column in which the electronic subpixel circuit that provides the current signal to the emissive area is located, and in other rows each subpixel emissive area of the first and third colors is located in a same column as the electronic subpixel circuit that provides the current signal to the emissive area.

Embodiment 7 is display device of any of embodiment 5 or 6, where, in every other row, each subpixel emissive area of the first color is located in a column having a column number higher than a column number of the electronic subpixel circuit that provides the current signal to the subpixel emissive area, and where, in rows for which each subpixel emissive area of the first color is located in a column having a column number higher than a column number of the electronic subpixel circuit that provides the current signal to the subpixel emissive area, each subpixel emissive area of the third color is located in a column having a lower column number lower than a column number of the electronic subpixel circuit that provides the current signal to the subpixel emissive area.

Embodiment 8 is display device of any of embodiment 5 or 6 or 7, where, in every other row, each subpixel emissive area of the first color is located in a column having a column number that is two higher than a column number of the electronic subpixel circuit that provides the current signal to the subpixel emissive area, and where, in rows for which each subpixel emissive area of the first color is located in a column having a column number that is two higher than a column number of the electronic subpixel circuit that provides the current signal to the subpixel emissive area, each subpixel emissive area of the third color is located in a column having a lower column number that is two lower than a column number of the electronic subpixel circuit that provides the current signal to the subpixel emissive area.

Embodiment 9 is display device of any of embodiments 6 through 8, where, in the every other rows, the subpixel output ports that electrically connect an emissive area of a first or third color to an electronic subpixel circuit, extend over a distance that is greater than a width of one subpixel circuit.

Embodiment 10 is display device of any of embodiments of embodiment 5 or 6, where, in every other row, each subpixel emissive area of the first color and each subpixel emissive area of the third color is located in a column having a higher column number higher than a column number of the electronic subpixel circuit that provides the current signal to the subpixel emissive area.

Embodiment 11 is display device of embodiment 10, where, in the every other row, in a first column, each subpixel emissive area of the third color is located in a column having a column number that is one higher than the column number of the electronic subpixel circuit that provides the current signal to the subpixel emissive area, and where, in the every other row, in columns other than the first column, each subpixel emissive area of the first color and of the third color is located in a column having a column number that is two higher than the column number of the electronic subpixel circuit that provides the current signal to the subpixel emissive area.

Embodiment 12 is display device of any of embodiments 10 or 11, where, in the every other rows, for columns other than the first column, the subpixel output ports that electrically connect an emissive area of a first or third color to an electronic subpixel circuit, extend over a distance that is greater than a width of one subpixel circuit.

Embodiment 13 is display device of embodiments 12, where in the first column includes a plurality of subpixel circuits but does not include subpixel emissive areas.

Embodiment 14 is display device of any of embodiments 1 through 13, where each of the subpixel circuits includes a transistor configured for providing a current to a subpixel emissive area in response to one or more signals provided on a scan line and/or column line.

Embodiment 15 is display device of any of embodiment 14, where an amount of light emitted from the subpixel emissive area is based on the provided current.

Embodiment 16 is display device of any of embodiments 1 through 15, and further comprising: a scan line driver configured for providing signals to the scan lines, a column line driver configured for providing signals to the column lines, and a timing controller configured to provide timing control signals to the scan line driver and to the column line driver.

Embodiment 17 is display device of any of embodiments 1 through 16, where the plurality of rows includes more than 1300 rows, and where the plurality of columns includes more than 700 columns.

In the above description, numerous details are set forth. It will be apparent, however, to one of ordinary skill in the art having the benefit of this disclosure, that implementations of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying," "determining," "calculating," "detecting," "transmitting," "receiving," "generating," "storing," "ranking," "extracting," "obtaining," "assigning," "partitioning," "computing," "filtering," "changing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices Implementations of the disclosure also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer readable storage medium, such as, but not limited to, any type of disk including floppy disks, optical disks, CD-ROMs and magnetic-optical disks, read-only memories (ROMs), random access memories (RAMs), EPROMS, EEPROMs, magnetic or optical cards, flash memory, or any type of media suitable for storing electronic instructions.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present disclosure is not described with reference to any particular programming language. It will be appreciated that a variety of programming languages may be used to implement the teachings of the disclosure as described herein.

The above description sets forth numerous specific details such as examples of specific systems, components, methods and so forth, in order to provide a good understanding of several implementations of the present disclosure. It will be apparent to one skilled in the art, however, that at least some implementations of the present disclosure may be practiced without these specific details. In other instances, well-known components or methods are not described in detail or are presented in simple block diagram format in order to avoid unnecessarily obscuring the present disclosure. Thus, the specific details set forth above are merely examples. Particular implementations may vary from these example details and still be contemplated to be within the scope of the present disclosure.

It is to be understood that the above description is intended to be illustrative and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A display device comprising:
    a plurality of subpixel emissive areas of a first color;
    a plurality of subpixel emissive areas of a second color;
    a plurality of subpixel emissive areas of a third color, wherein the plurality of subpixel emissive areas of the first, second, and third colors are arranged in an array, the array having a plurality of rows and a plurality of columns, with rows of the array including subpixel emissive areas arranged in a repeating pattern of a first color subpixel emissive area, second color subpixel emissive area, a third color subpixel emissive area, and a second color subpixel emissive area, and with alternating columns of the array including subpixel emissive areas: (a) arranged in a repeating pattern of a subpixel emissive area of the first color and subpixel emissive areas of the third color, and (b) including only subpixel emissive areas of the second color;
    a plurality of scan lines;
    a plurality of column lines; and
    a plurality of electronic subpixel circuits arranged in the array, each electronic subpixel circuit configured for receiving electronical signals from a scan line and from a column line and for converting the received signals into a current signal provided to one of the subpixel emissive areas to drive light emission from the subpixel emissive area,
wherein in alternating rows of the array, subpixel emissive areas of the first color and subpixel emissive areas of the third color are driven by subpixel circuits located in different columns than the emissive area that is being driven, such that electronic subpixel circuits arranged in a column of the array drive columns of emissive areas having only one color.

2. The display device of claim 1, wherein the emissive areas of the first, second, and third colors include organic light emitting diodes.

3. The display device of claim 1, wherein the first color includes red (R), the second color includes green (G), the third color includes blue (B), and wherein the plurality of subpixel emissive areas of the first, second, and third colors are arranged in a Pentile RGBG array.

4. The display device of claim 1, wherein subpixel circuits in a column of the array are electrically connected to a same column line.

5. The display device of claim 1, further comprising a plurality of subpixel circuit output ports, wherein each electronic subpixel circuit of the plurality of electronic subpixel circuits is electrically connected to an emissive area by a subpixel circuit output port of the plurality of subpixel circuit output ports.

6. The display device of claim 5,
wherein, in every other row, each subpixel emissive area of the first color is located in a column having a column number higher than a column number of the electronic subpixel circuit that provides the current signal to the subpixel emissive area, and
wherein, in rows for which each subpixel emissive area of the first color is located in a column having a column number higher than a column number of the electronic subpixel circuit that provides the current signal to the subpixel emissive area, each subpixel emissive area of the third color is located in a column having a lower column number than a column number of the electronic subpixel circuit that provides the current signal to the subpixel emissive area.

7. The display device of claim 5,
wherein, in every other row, each subpixel emissive area of the first color is located in a column having a column number that is two higher than a column number of the electronic subpixel circuit that provides the current signal to the subpixel emissive area, and
wherein, in rows for which each subpixel emissive area of the first color is located in a column having a column number that is two higher than a column number of the electronic subpixel circuit that provides the current signal to the subpixel emissive area, each subpixel emissive area of the third color is located in a column having a column number that is two lower than a column number of the electronic subpixel circuit that provides the current signal to the subpixel emissive area.

8. The display device of claim 5,
wherein, in every other row, each subpixel emissive area of the first color and each subpixel emissive area of the third color is located in a column having a higher column number higher than a column number of the electronic subpixel circuit that provides the current signal to the subpixel emissive area.

9. The display device of claim 8,
wherein, in the every other row, in a first column, each subpixel emissive area of the third color is located in a column having a column number that is one higher than the column number of the electronic subpixel circuit that provides the current signal to the subpixel emissive area, and
wherein, in the every other row, in columns other than the first column, each subpixel emissive area of the first color and of the third color is located in a column having a column number that is two higher than the column number of the electronic subpixel circuit that provides the current signal to the subpixel emissive area.

10. The display device of claim 8, wherein, in the every other row,
for columns other than the first column, the subpixel output ports that electrically connect an emissive area of a first or third color to an electronic subpixel circuit, extend over a distance that is greater than a width of one subpixel circuit.

11. The display device of claim 10, wherein in the first column includes a plurality of subpixel circuits but does not include subpixel emissive areas.

12. The display device of claim 1, wherein each of the subpixel circuits includes a transistor configured for providing a current to a subpixel emissive area in response to one or more signals provided on a scan line and/or column line.

13. The display device of claim 12, wherein an amount of light emitted from the subpixel emissive area is based on the provided current.

14. The display device of claim 1, further comprising:
a scan line driver configured for providing signals to the scan lines;
a column line driver configured for providing signals to the column lines; and
a timing controller configured to provide timing control signals to the scan line driver and to the column line driver.

15. The display device of claim 1, wherein the plurality of rows includes more than 1300 rows, and wherein the plurality of columns includes more than 700 columns.

16. A display device comprising:
a plurality of subpixel emissive areas of a first color;
a plurality of subpixel emissive areas of a second color;
a plurality of subpixel emissive areas of a third color, wherein the plurality of subpixel emissive areas of the first, second, and third colors are arranged in an array, the array having a plurality of rows and a plurality of columns, with rows of the array including subpixel emissive areas arranged in a repeating pattern of a first color subpixel emissive area, second color subpixel emissive area, a third color subpixel emissive area, and a second color subpixel emissive area, and with alternating columns of the array including subpixel emissive areas: (a) arranged in a repeating pattern of a subpixel emissive area of the first color and subpixel emissive areas of the third color, and (b) including only subpixel emissive areas of the second color;
a plurality of scan lines;
a plurality of column lines;
a plurality of electronic subpixel circuits arranged in the array, each electronic subpixel circuit configured for receiving electronical signals from a scan line and from a column line and for converting the received signals into a current signal provided to one of the subpixel emissive areas to drive light emission from the subpixel emissive area; and a plurality of subpixel circuit output ports, wherein each electronic subpixel circuit of the plurality of electronic subpixel circuits is electrically connected to an emissive area by a subpixel circuit output port of the plurality of subpixel circuit output ports;

wherein electronic subpixel circuits arranged in a column of the array drive columns of emissive areas having only one color, wherein each subpixel emissive area of the second color, the electronic subpixel circuit that provides the current signal to the emissive area of the second color, and the output port that electrically connects the subpixel emissive area of the second color to the electronic subpixel circuit that provides the current signal to the subpixel emissive area of the second color are located in a same row and in a same column, and wherein, in every other row, each subpixel emissive area of the first and third colors is located in a different column from the column in which the electronic subpixel circuit that provides the current signal to the emissive area is located, and in other rows each subpixel emissive area of the first and third colors is located in a same column as the electronic subpixel circuit that provides the current signal to the emissive area.

17. The display device of claim 16, wherein, in the every other row, the subpixel output ports that electrically connect an emissive area of a first or third color to an electronic subpixel circuit, extend over a distance that is greater than a width of one subpixel circuit.

* * * * *